(12) United States Patent
Huang et al.

(10) Patent No.: US 9,954,140 B2
(45) Date of Patent: Apr. 24, 2018

(54) LIGHT-EMITTING DEVICE

(71) Applicant: EPISTAR CORPORATION, Hsinchu (TW)

(72) Inventors: Chien-Fu Huang, Hsinchu (TW); Shiuan-Leh Lin, Hsinchu (TW); Chih-Chiang Lu, Hsinchu (TW); Chia-Liang Hsu, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 15/596,644

(22) Filed: May 16, 2017

(65) Prior Publication Data

US 2017/0250310 A1 Aug. 31, 2017

Related U.S. Application Data

(63) Continuation of application No. 14/992,785, filed on Jan. 11, 2016, now Pat. No. 9,793,454, which is a continuation of application No. 14/038,969, filed on Sep. 27, 2013, now Pat. No. 9,269,870, which is a continuation-in-part of application No. 13/050,444, filed on Mar. 17, 2011, now Pat. No. 9,601,657.

(51) Int. Cl.
| | |
|---|---|
| *H01L 33/12* | (2010.01) |
| *H01L 33/46* | (2010.01) |
| *H01L 33/30* | (2010.01) |
| *H01L 33/32* | (2010.01) |
| *H01L 33/22* | (2010.01) |

(52) U.S. Cl.
CPC .............. *H01L 33/12* (2013.01); *H01L 33/22* (2013.01); *H01L 33/30* (2013.01); *H01L 33/32* (2013.01); *H01L 33/46* (2013.01); *H01L 2933/0091* (2013.01)

(58) Field of Classification Search
CPC ......... H01L 33/12; H01L 33/22; H01L 33/30; H01L 33/46; H01L 33/32
See application file for complete search history.

(56) References Cited

U.S. PATENT DOCUMENTS

| | | | |
|---|---|---|---|
| 6,542,528 B1 | 4/2003 | Sato et al. | |
| 6,720,586 B1 | 4/2004 | Kidoguchi et al. | |
| 7,811,845 B2 | 10/2010 | Hsu et al. | |
| 7,829,914 B2* | 11/2010 | Son | H01L 33/12 257/103 |
| 2001/0007361 A1* | 7/2001 | Nakamura | H01L 33/12 257/97 |
| 2003/0173574 A1 | 9/2003 | Koide et al. | |

(Continued)

FOREIGN PATENT DOCUMENTS

CN 101271949 A 9/2008

*Primary Examiner* — Benjamin Sandvik
*Assistant Examiner* — Farid Khan
(74) *Attorney, Agent, or Firm* — Muncy, Geissler, Olds & Lowe, P.C.

(57) ABSTRACT

The present disclosure provides a light-emitting device. The light-emitting device comprises: a substrate; an intermediate layer on the substrate; a first window layer comprising a first semiconductor optical layer on the intermediate layer and a second semiconductor optical layer on the first semiconductor optical layer; and a light-emitting stack on the second semiconductor optical layer; wherein a difference between the lattice constant of the intermediate layer and the lattice constant of the first semiconductor optical layer is greater than 2.3 Å.

20 Claims, 22 Drawing Sheets

(56) References Cited

U.S. PATENT DOCUMENTS

| | | |
|---|---|---|
| 2005/0257824 A1 | 11/2005 | Maltby et al. |
| 2006/0125985 A1 | 6/2006 | Chen |
| 2006/0176924 A1 | 8/2006 | Kim et al. |
| 2006/0289875 A1 | 12/2006 | Shieh et al. |
| 2007/0045608 A1* | 3/2007 | Wang .................... H01L 33/02 257/14 |
| 2007/0274360 A1 | 11/2007 | Inoue et al. |
| 2008/0042155 A1 | 2/2008 | Furuta et al. |
| 2008/0073659 A1 | 3/2008 | Tamura et al. |
| 2008/0088932 A1* | 4/2008 | Cho ...................... G02B 1/113 359/586 |
| 2008/0169479 A1 | 7/2008 | Xu et al. |
| 2008/0283819 A1 | 11/2008 | Konno |
| 2009/0050909 A1 | 2/2009 | Chen |
| 2009/0140267 A1* | 6/2009 | Kim ..................... H01L 33/007 257/86 |
| 2009/0145476 A1 | 6/2009 | Fetzer et al. |
| 2009/0206354 A1 | 8/2009 | Kitano et al. |
| 2009/0294784 A1 | 12/2009 | Nakahara et al. |
| 2010/0006862 A1 | 1/2010 | Cheng |
| 2010/0012968 A1 | 1/2010 | Yahata et al. |
| 2010/0038664 A1 | 2/2010 | Strauss |
| 2010/0059734 A1 | 3/2010 | Kaneko et al. |
| 2010/0133507 A1 | 6/2010 | Takao et al. |
| 2010/0252103 A1 | 10/2010 | Yao et al. |
| 2010/0264445 A1 | 10/2010 | Niki et al. |
| 2010/0320488 A1 | 12/2010 | Horie |
| 2011/0101391 A1* | 5/2011 | Miki .................. C23C 16/0272 257/94 |
| 2011/0156066 A1 | 6/2011 | Yao et al. |
| 2011/0272720 A1 | 11/2011 | Gardner et al. |
| 2013/0009167 A1 | 1/2013 | Tan et al. |
| 2013/0206217 A1* | 8/2013 | Liu .................... H01L 31/0296 136/255 |
| 2013/0322081 A1 | 12/2013 | Pan et al. |
| 2014/0070246 A1 | 3/2014 | Sabathil et al. |
| 2014/0191264 A1 | 7/2014 | Kim et al. |

* cited by examiner

LIGHT-EMITTING DEVICE

RELATED APPLICATION

This application is a continuation application of a previously filed U.S. patent application Ser. No. 14/992,785 filed on Jan. 11, 2016, entitled as "LIGHT-EMITTING DEVICE", which is a continuation application of a previously filed U.S. patent application Ser. No. 14/038,969 filed on Sep. 27, 2013, entitled as "LIGHT-EMITTING DEVICE WITH INTERMEDIATE LAYER", which is a continuation-in-part of a previously filed U.S. patent application Ser. No. 13/050,444 filed on Mar. 17, 2011, entitled as "LIGHT-EMITTING DEVICE". The disclosures of all references cited herein are incorporated by reference.

BACKGROUND

Technical Field

The present disclosure relates to a method for making a light-emitting device, and in particular to a method for making a light-emitting device comprising a bonding layer.

Description of the Related Art

The light-emitting diodes (LEDs) of the solid-state lighting elements have the characteristics of the low power consumption, low heat generation, long operational life, shockproof, small volume, quick response and good opto-electrical property like light emission with a stable wavelength, so the LEDs have been widely used in household appliances, indicator light of instruments, and opto-electrical products, etc.

Recently, a light-emitting device with a flip-chip package structure having light emitted toward the substrate is developed. However, how to improve the light-emitting efficiency of the light-emitting device is still an important issue in this art.

SUMMARY OF THE DISCLOSURE

The present disclosure provides a light-emitting device. The light-emitting device comprises: a substrate; an intermediate layer on the substrate; a first window layer comprising a first semiconductor optical layer on the intermediate layer and a second semiconductor optical layer on the first semiconductor optical layer; and a light-emitting stack on the second semiconductor optical layer; wherein a difference between the lattice constant of the intermediate layer and the lattice constant of the first semiconductor optical layer is greater than 2.3 Å.

BRIEF DESCRIPTION OF THE DRAWINGS

The accompanying drawings are included to provide easy understanding of the application, and are incorporated herein and constitute a part of this specification. The drawings illustrate the embodiments of the application and, together with the description, serve to illustrate the principles of the application.

DETAILED DESCRIPTION OF THE EMBODIMENTS

To better and concisely explain the disclosure, the same name or the same reference number given or appeared in different paragraphs or figures along the specification should has the same or equivalent meanings while it is once defined anywhere of the disclosure.

The following shows the description of the embodiments of the present disclosure in accordance with the drawings.

Figure 1:
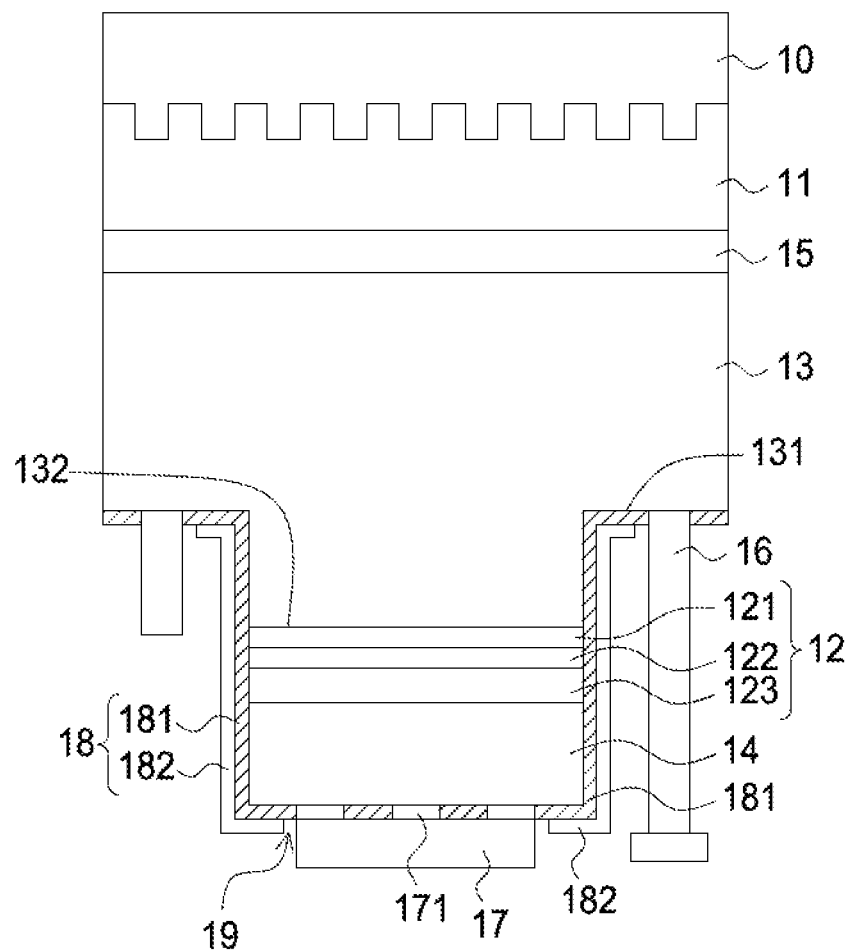
FIG. 1 shows a cross-sectional view of a light-emitting device in accordance with the first embodiment of the present disclosure.

FIG. 1 discloses a light-emitting device 100 according to the first embodiment of the present disclosure. The light-emitting device 100 comprises a permanent substrate 10, an intermediate layer 11 formed on the permanent substrate 10, a transparent bonding layer 15, a first semiconductor window layer 13 bonded to the intermediate layer 11 through the transparent bonding layer 15, a light-emitting stack 12 formed on the first semiconductor window layer 13, a second semiconductor window layer 14 formed on the light-emitting stack 12 opposite to the first semiconductor window layer 13. In this embodiment, the intermediate layer 11 has a refractive index between the refractive index of the permanent substrate 10 and the refractive index of the first semiconductor window layer 13. For example, the permanent substrate 10 is a sapphire substrate having the refractive index of 1.7, the intermediate layer 11 comprises gallium nitride or diamond having the refractive index of 2.4, and the first semiconductor window layer 13 is gallium phosphide (GaP) having the refractive index of 3.37. Since the refractive index is gradually reduced from the first semiconductor window layer 13 to the permanent substrate 10, the total light reflection in the light-emitting device 100 can be attenuated. In one embodiment, the permanent substrate 10 has the refractive index ranging from 2.4 to 3.4, the intermediate layer 11 has the refractive index ranging from 1.7 to 3.4, and the first semiconductor window layer 13 has the refractive index ranging from 1.4 to 1.7. In addition, the permanent substrate 10 is a patterned substrate for improving light efficiency of the light-emitting stack 12. Alternatively, the permanent substrate 10 can have a flat surface. In one embodiment, when the permanent substrate 10 has a flat surface, the intermediate layer 11 can comprises a plurality of pores formed therein so as to form a porous structure (not shown) for scattering light. The pores are formed by dry etching such as inductive coupling plasma (ICP), or wet etching using potassium hydroxide, oxalic acid, sulfuric-acid, phosphoric acid or combinations thereof.

Referring to FIG. 1, the first semiconductor window layer 13 comprises a recess portion 131 and a flat surface 132. The light-emitting stack 12 is formed on the flat surface 132. The light-emitting device 100 further comprises a plurality of patterned contacts 171 formed on the second semiconductor window layer 14 for spreading current. In addition, the light-emitting device 100 further comprises a mirror layer 18. In this embodiment, the mirror layer 18 comprises an insulation layer 181 for preventing undesired current path, and a reflective layer 182 formed on portions of the insulation layer 181 for reflecting the light toward the first semiconductor window layer 13. The insulation layer 181 covers a side surface and the recess portion 131 of the first semiconductor window layer 13, and further covers side walls of the light-emitting stack 12 and the second semiconductor window layer 14. Moreover, the insulation layer 181 is also formed on the second semiconductor window layer 14, but not formed on the contacts 171. The light-emitting device 100 further comprises a first electrode 16 formed on the recess portion 131 of the first semiconductor window layer 13, and a second electrode 17 formed on the patterned contacts 171 and portions of the insulation layer 181 for electrically connecting to the light-emitting stack 12 for emitting light. A gap 19 is formed between the reflective layer 182 and the second electrode 17. The insulation layer 181 comprises oxide such as $SiO_2$, $Ta_2O_5$, $TiO_2$, $Al_2O_3$, nitride such as $Si_3N_4$, AlN, or polymer. The reflective layer 182 comprises metal, such as Al, Ag, Au or Cu. Alternatively, the insulation layer 181 and the reflective layer 182 can comprise a multi-layer structure. Moreover, the mirror layer 18 can merely comprise the insulation layer 181 having a multi-layer structure, such as distributed Bragg reflectors (DBR).

In this embodiment, the first semiconductor window layer 13 has a layer thickness greater than that of the second semiconductor window layer 14. The greater the thickness of the first semiconductor window layer 13, the easier the light escape from the light-emitting device 100 would be. In one embodiment, the first semiconductor window layer 13 has a layer thickness ranging from 1.2 µm to 10 µm. The second semiconductor window layer 14 has a layer thickness ranging from 0.1 µm to 5 µm.

In this embodiment, the light-emitting stack 12 comprises a p-type semiconductor layer 121, an active layer 122, and an n-type semiconductor layer 123. Each of the p-type semiconductor layer 121, the active layer 122, and the n-type semiconductor layer 123 comprises group III-V compound semiconductor, such as GaN based material or GaP based material. The permanent substrate 10 is transparent and comprises glass, sapphire, or quartz. The transparent bonding layer 15 comprises indium tin oxide (ITO), benzocyclobutene (BCB), epoxy resin (Epoxy), polydimethylsiloxane (PDMS), silicon oxide ($SiO_x$), aluminum oxide ($Al_2O_3$), titanium dioxide ($TiO_2$), silicon nitride ($SiN_x$), or combinations thereof. The transparent bonding layer 15 can comprises a multi-layer structure and have a thickness ranging from 10 nm to 5 µm.

It is noted that the intermediate layer 11 can be bonded to the first semiconductor window layer 13 by a direct bonding without the transparent bonding layer 15. The direct bonding is performed under a temperature of 200-500° C. and a pressure less than 1 mtorr, and a composite material is formed at the interface between the intermediate layer 11 and the first semiconductor window layer 13 during the direct bonding process.

FIGS. 2A to 2D disclose a light-emitting device 200 according to the second embodiment of the present disclosure. The light-emitting device 200 of the second embodiment has the similar structure with the light-emitting device 100 of the first embodiment except that the mirror layer 18 further comprises a layer 183 formed on the second semiconductor window layer 14 and the contacts 171. The second electrode 17 is formed on the layer 183. Since the contacts 171 ohmicly contact the second semiconductor window layer 14, when a voltage is applied on the second electrode 17, most current flows through the contacts 171 to the second semiconductor window layer 14 for spreading current. The insulation layer 181 and the reflective layer 182 are merely formed on the side wall of the light-emitting stack 12 and the first and second semiconductor window layers 13, 14. The contacts 171 contain metal such as Cu, Al, In, Sn, Au, Pt, Zn, Ag, Ti, Ni, Pb, Pd, Ge, Ni, Cr, Cd, Co, Mn, Sb, Bi, Ga, Tl, Po, Ir, Re, Rh, Os, W, Li, Na, K, Be, Mg, Ca, Sr, Ba, Zr, Mo, La, Ge—Au, Be—Au, Cr—Au, Ag—Ti, Cu—Sn, Cu—Zn, Cu—Cd, Sn—Pb—Sb, Sn—Pb—Zn, Ni—Sn, Ni—Co, or Au alloy.

Figure 2A:
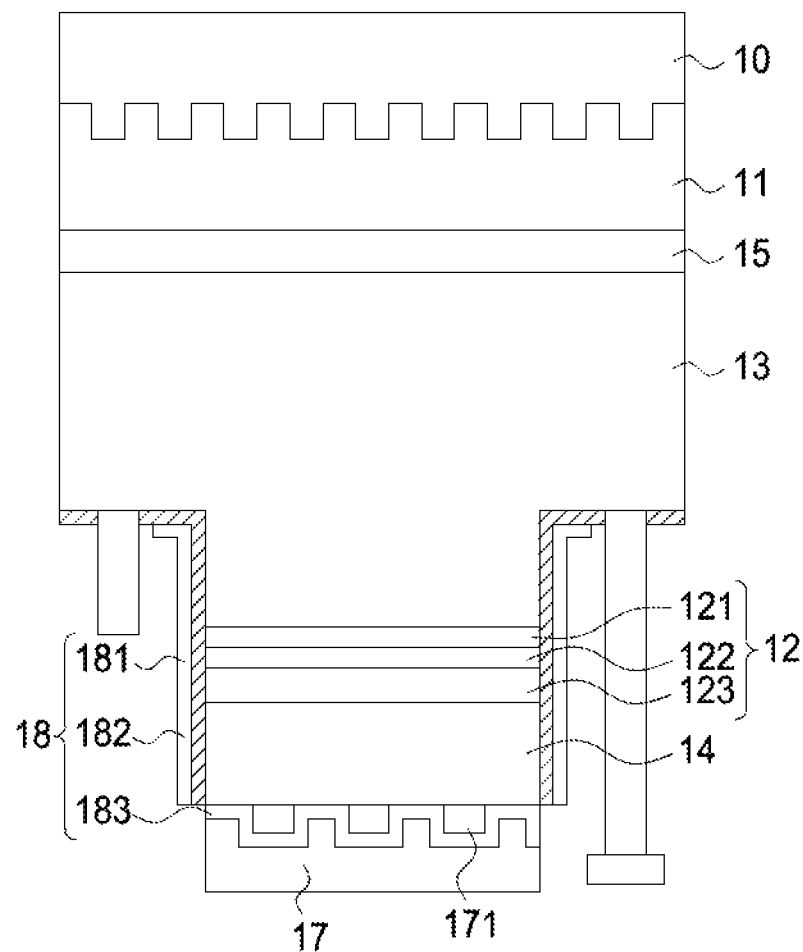
FIGS. 2A to 2D show a cross-sectional view of a light-emitting device in accordance with the second embodiment of the present disclosure.
Figure 2B:
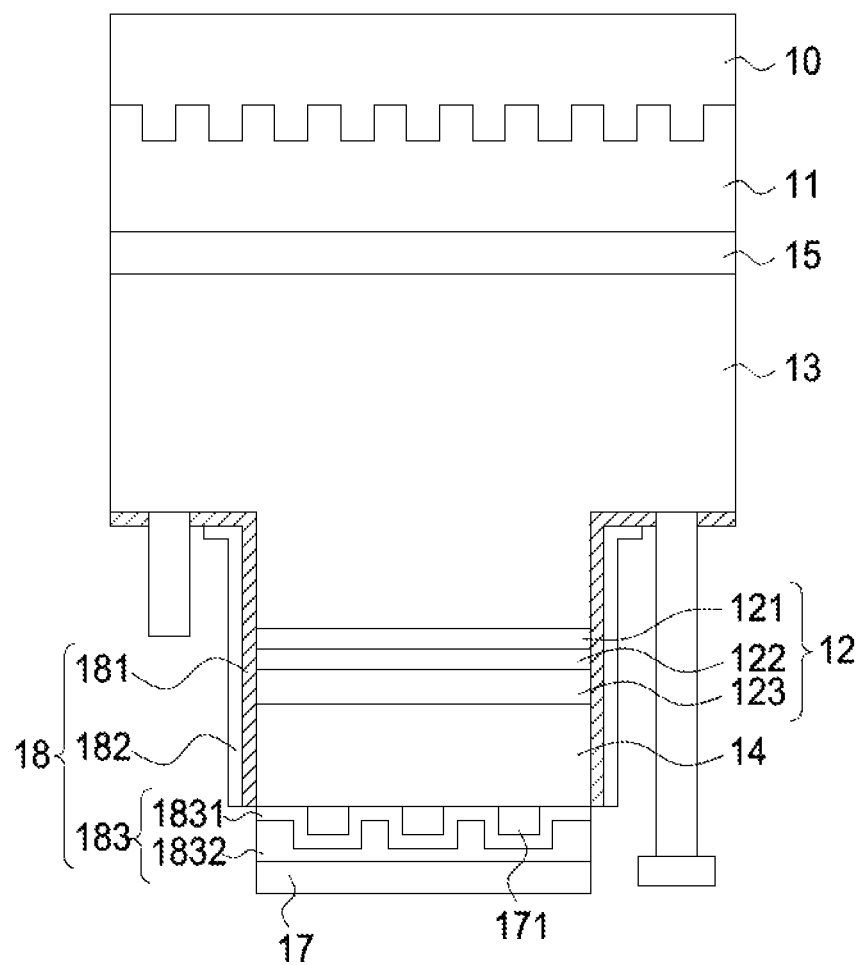
Figure 2C:
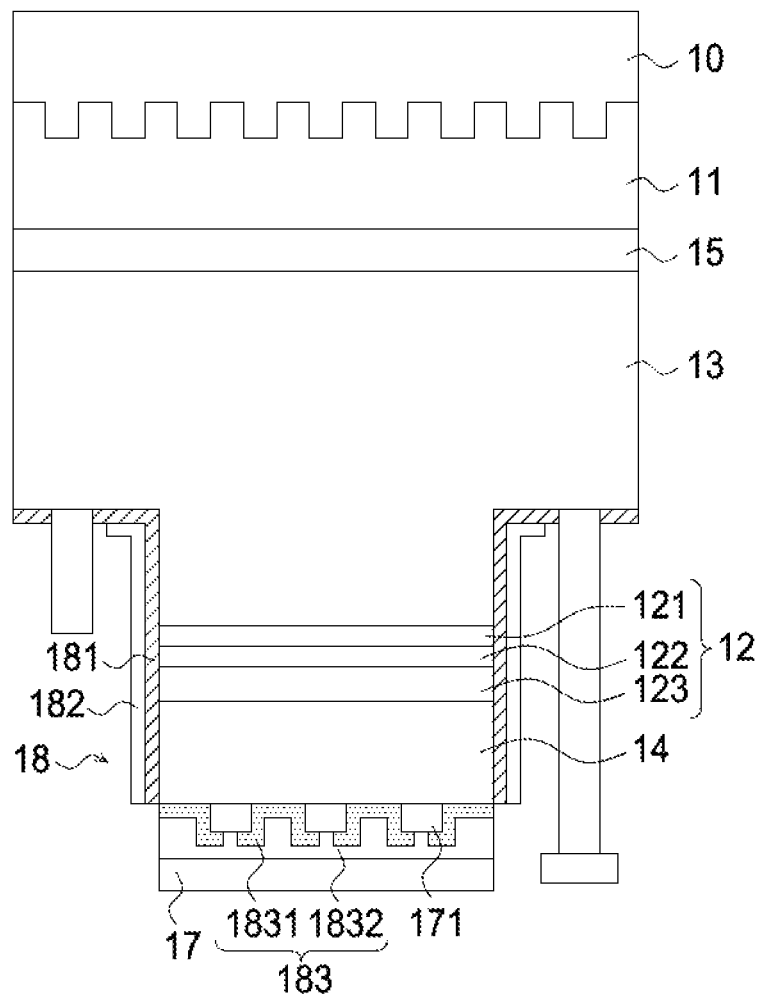
Figure 2D:
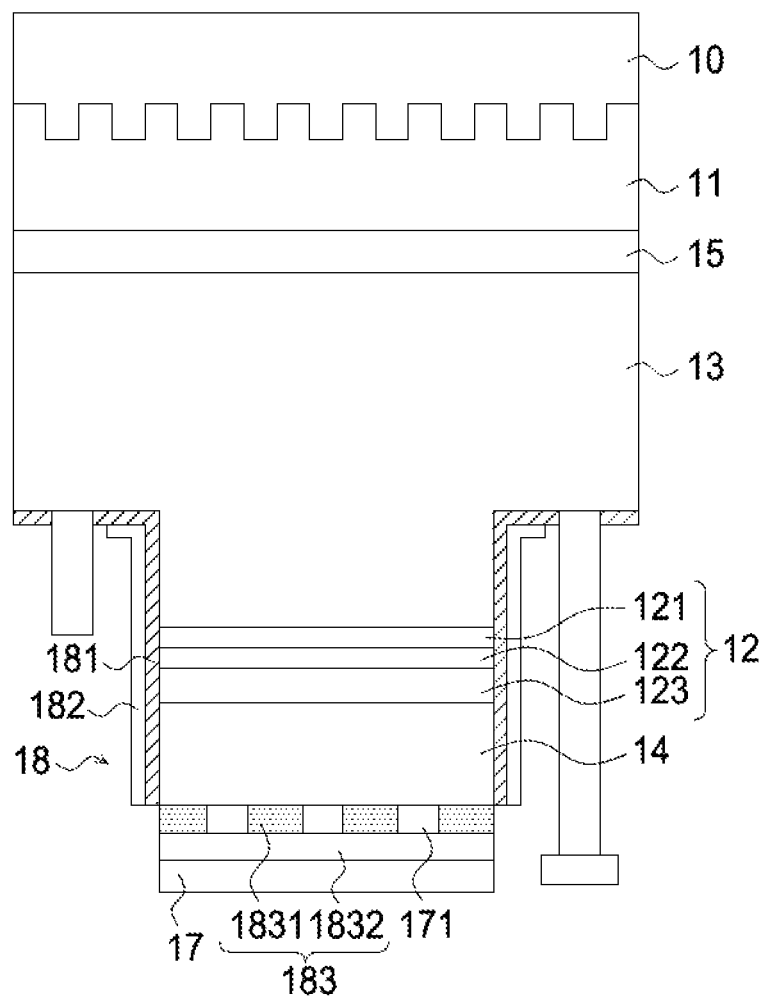

Referring to FIG. 2A, the layer 183 is made of metal comprising Au, Ni, Cu, Ag, or Al. Referring to FIGS. 2B to 2D, the layer 183 can be an omni-directional reflector (ODR) structure comprising a first layer 1831 and a second layer 1832. Referring to FIG. 2B, the first layer 1831 is formed on the second semiconductor window layer 14 and the contacts 171, and the material of the first layer 1831 is ITO. The second layer 1832 of Ag is formed on the ITO layer. Alternatively, the first layer 1831 can be directly formed on the second window semiconductor layer 14 without formation of the contacts 17 therebetween for ohmicly contacting with the second window semiconductor layer 14. Referring to FIG. 2C, the first layer 1831 is formed on the second semiconductor window layer 14 and portions of the contacts 171 wherein the material of the first layer 1831 is $SiO_2$. The second layer 1832 comprising Ag, Al or Cu is formed on the $SiO_2$ layer and the contacts 171 uncovered by the $SiO_2$ layer for electrically connecting with second semiconductor window layer 14 through the contacts 171. Referring to FIG. 2D, the first layer 1831 of $SiO_2$ is formed on the second semiconductor window layer 14 and flush with the contacts 171. The second layer 1832 is formed on the $SiO_2$ layer.

Figure 3:
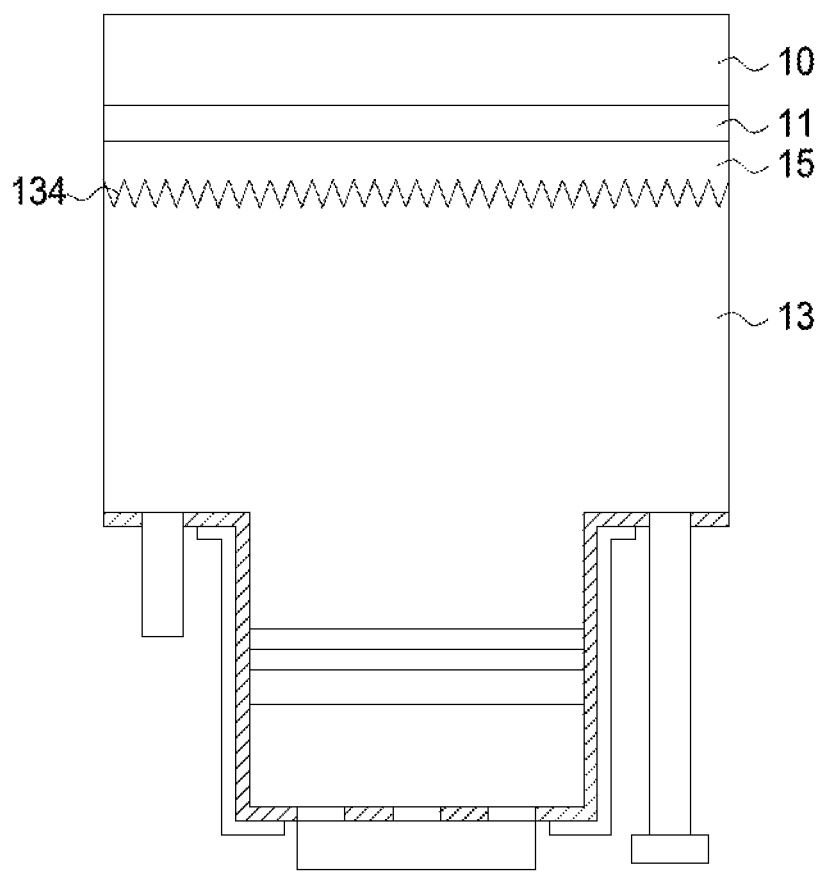
FIG. 3 shows a cross-sectional view of a light-emitting device in accordance with the third embodiment of the present disclosure.

FIG. 3 discloses a light-emitting device 300 according to the third embodiment of the present disclosure. The light-emitting device 300 of the third embodiment has the similar structure with the light-emitting device 100 of the first embodiment except that the first semiconductor window layer 13 has a scattering surface 134 facing toward the permanent substrate 10 for scattering the light emitted from the light-emitting stack 12. The permanent substrate 10 has a flat surface. The scattering surface 134 can be formed by surface texturing or doping. The surface texturing can be performed by etching.

Figure 4:
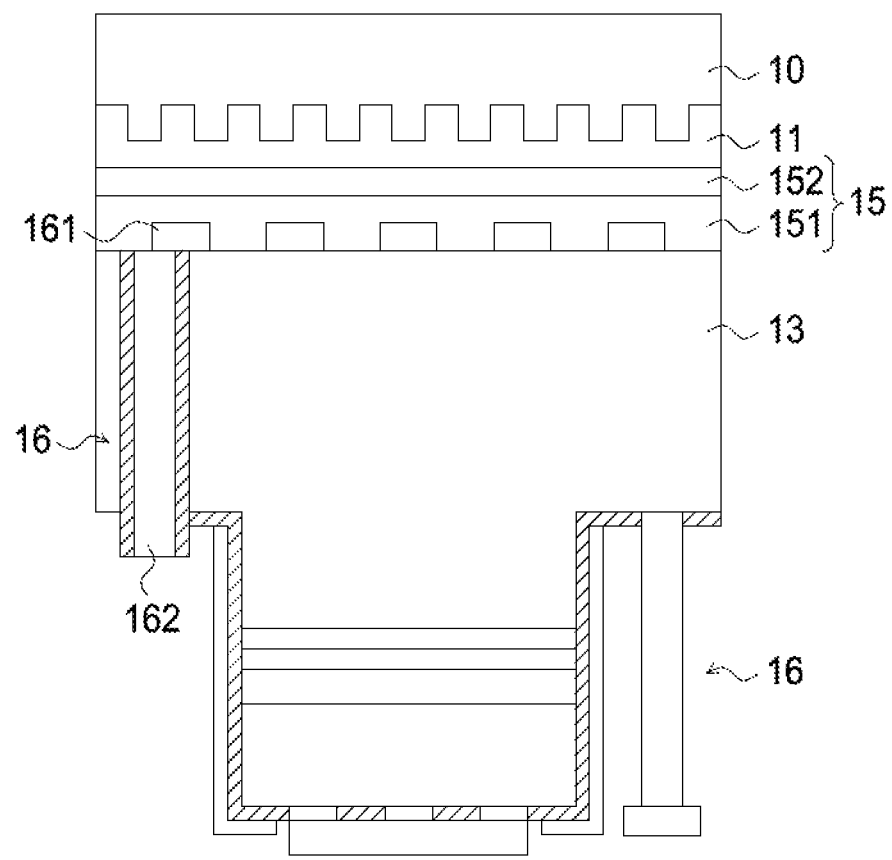
FIG. 4 shows a cross-sectional view of a light-emitting device in accordance with the fourth embodiment of the present disclosure.

FIG. 4 discloses a light-emitting device 400 according to the fourth embodiment of the present disclosure. The light-emitting device 400 of the fourth embodiment has the similar structure with the light-emitting device 100 of the first embodiment except that the light-emitting device 400 further comprises a plurality of ohmic contact parts 161 formed between the transparent bonding layer 15 and the first semiconductor window layer 13 for uniformly spreading current. Moreover, the first electrode 16 has a finger electrode 162 extending through the first semiconductor window layer 13 for electrically connecting with one of the ohmic contact parts 161. In this embodiment, the ohmic contact parts 161 are spaced apart from each other, and the transparent bonding layer 15 comprises a transparent conductive layer 151 such as indium titanium oxide (ITO) covering the ohmic contact parts 161 for electrical connection therebetween. The transparent bonding layer 15 further comprises a transparent layer 152 comprising indium titanium oxide (ITO), silicon dioxide ($SiO_2$), or aluminum oxide ($Al_2O_3$). The ohmic contact parts 161 comprises metal such as Ge, Au, Ni, Cu, or combinations thereof.

Figure 5:
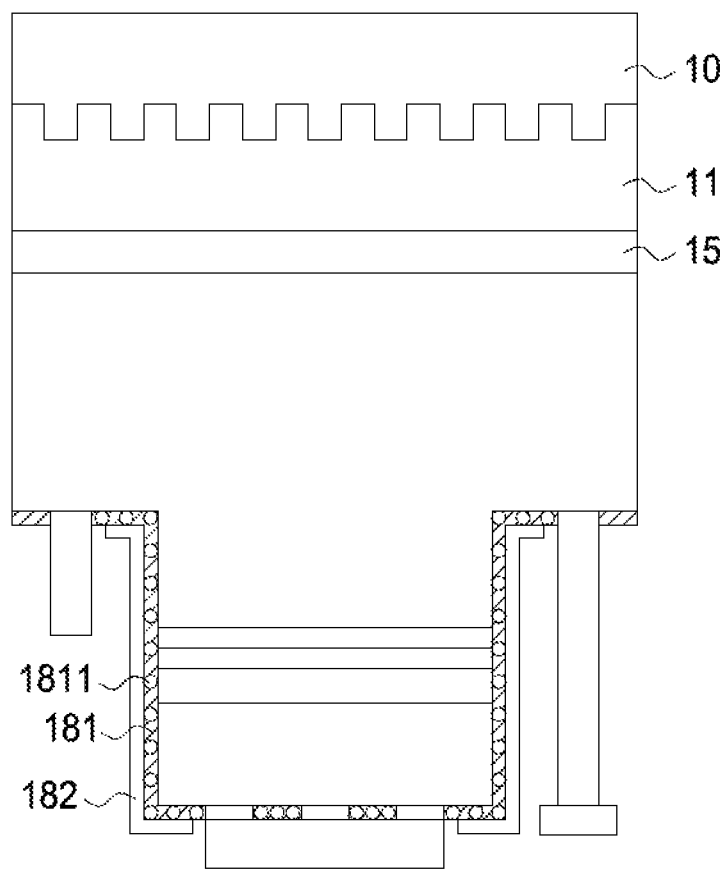
FIG. 5 shows a cross-sectional view of a light-emitting device in accordance with the fifth embodiment of the present disclosure.

FIG. 5 discloses a light-emitting device 500 according to the fifth embodiment of the present disclosure. The light-emitting device 500 of the fifth embodiment has the similar structure with the light-emitting device 100 of the first embodiment except that the insulation layer 181 comprises a plurality of particles 1811 dispersed therein for providing a curved surface such that light refraction occurs at the curved surface to change a light-emitting angle. Each of the particles 1811 has a diameter ranging from 0.3 μm to 5 μm. The particles 1811 comprise glass, polymer, or ceramic material. The transparent bonding layer 15 can also comprises the particles for scattering light. The particles 1811 are formed within the insulation layer 181 by a spin-on process a printing process, or a dipping process.

Figure 6:
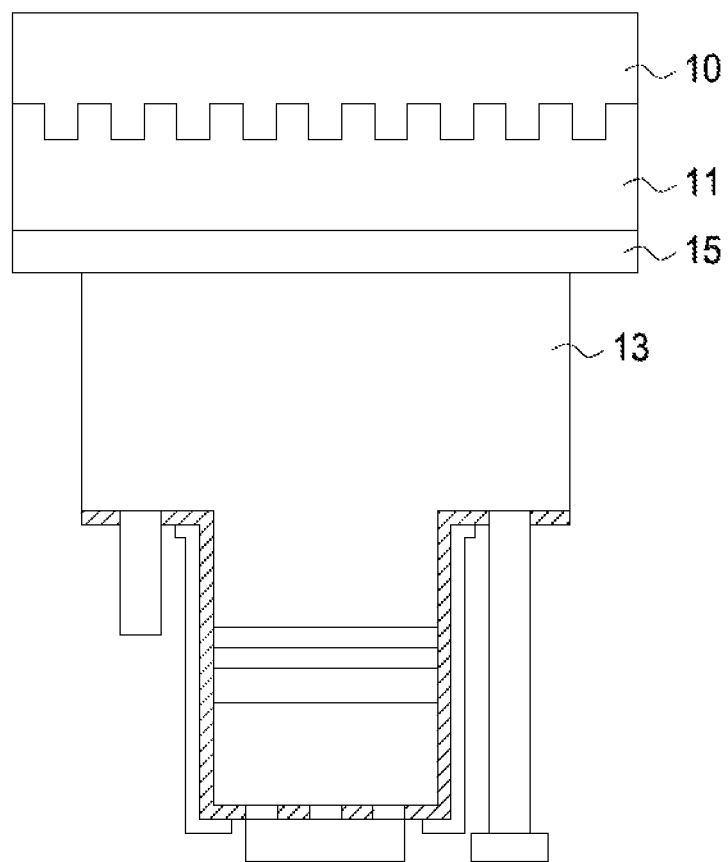
FIG. 6 shows a cross-sectional view of a light-emitting device in accordance with the sixth embodiment of the present disclosure.

FIG. 6 discloses a light-emitting device 600 according to the sixth embodiment of the present disclosure. The light-emitting device 600 of the sixth embodiment has the similar structure with the light-emitting device 400 of the first embodiment except that the first semiconductor window layer 13 has a smaller area than that of the transparent bonding layer 15. Accordingly, there is no by-product formed on the first semiconductor window layer 13 which is produced from separating a plurality of the light-emitting diodes into an individual chip by laser, thereby improving light efficiency.

Figure 7A:
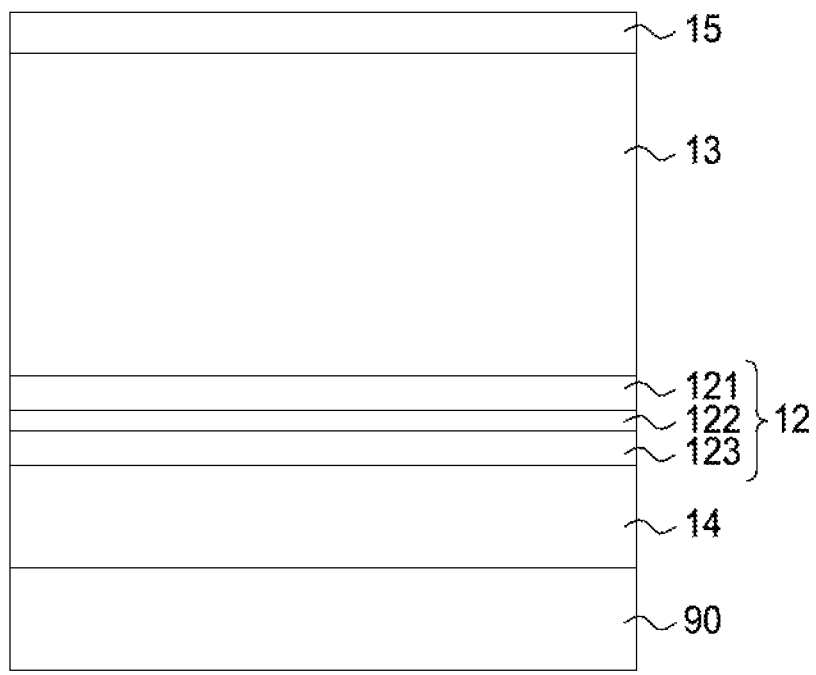
FIGS. 7A to 7F are cross-sectional views showing a method of making the light-emitting device in accordance with the first embodiment of the present disclosure.

FIGS. 7A to 7G illustrate a method of making the light-emitting device 100 according to the first embodiment of the present disclosure. Referring to FIG. 7A, the second semiconductor window layer 14 of AlGaInP and the light-emitting stack 12 comprising the n-type semiconductor layer 123, and the active layer 122, the p-type semiconductor layer 121 are sequentially grown on a growth substrate 90. Subsequently, the first semiconductor window layer 13 of GaP is formed on the p-type semiconductor layer 121, and the transparent bonding layer 15 comprising a bilayer structure of $SiO_2$ and $Al_2O_3$ is formed on the first semiconductor window layer 13. The growth substrate 90 comprises sapphire, silicon carbide, gallium nitride, gallium aluminum, and combinations thereof.

Figure 7B:
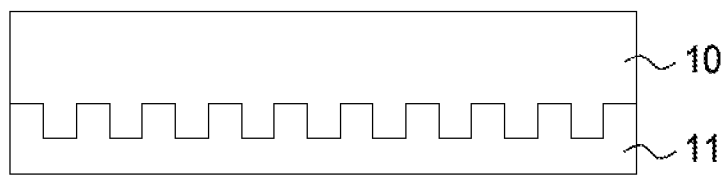

Referring to FIG. 7B, the permanent substrate 10 is provided for growing the intermediate layer 11 of GaN thereon. Before the growth of the intermediate layer 11, the permanent substrate 10 is etched to form a patterned substrate.

Figure 7C:
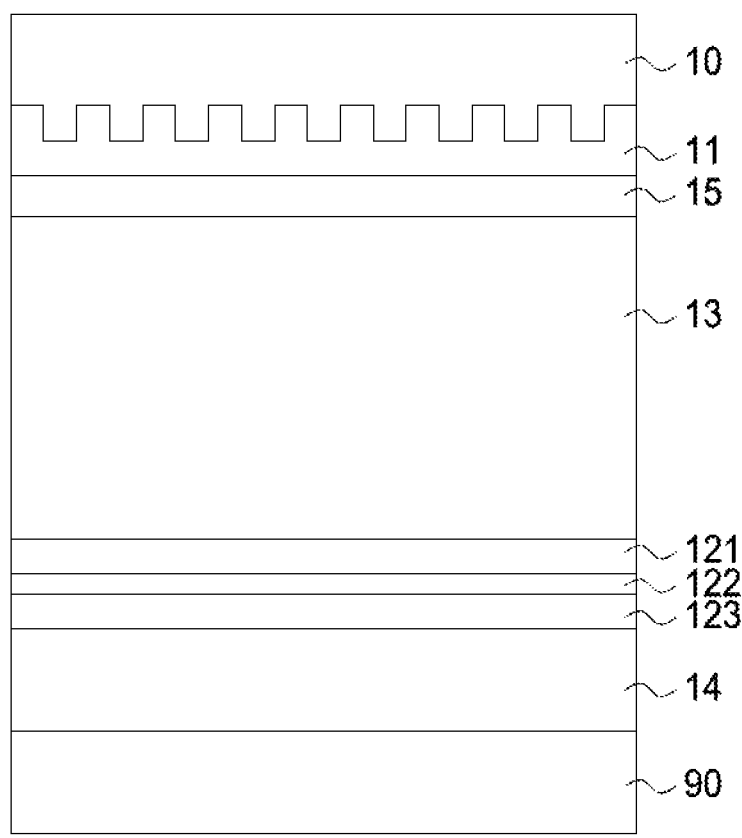

Referring to FIG. 7C, the intermediate layer 11 is bonded to the first semiconductor window layer 13 through the transparent bonding layer 15.

Figure 7D:
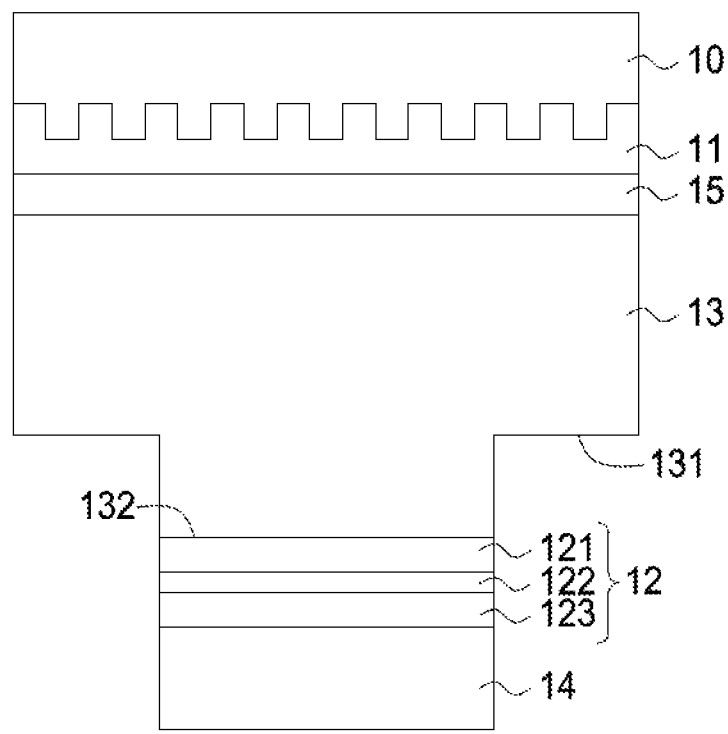

Referring to FIG. 7D, after removing the growth substrate 90, portions of the n-type semiconductor layer 123, the active layer 122, the p-type semiconductor layer 121, and the second semiconductor window layer 14 are removed to expose the first semiconductor window layer 13. Furthermore, portions of the first semiconductor window layer 13 are removed to form a recess portion 131 and a flat surface 132 on which the light-emitting stack 12 and the second semiconductor window layer 14 are formed.

Figure 7E:
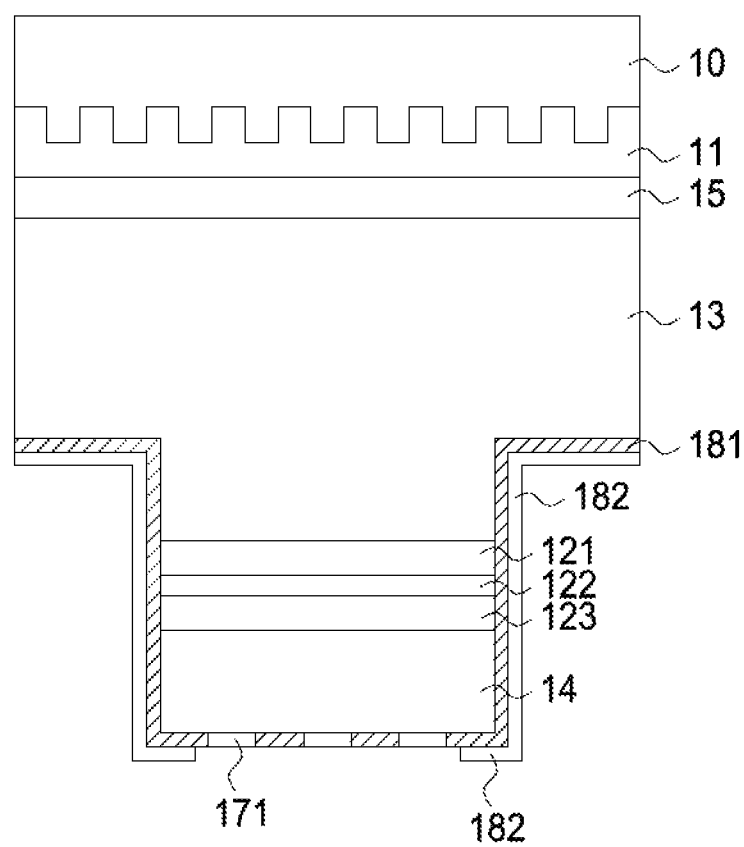

Referring to FIG. 7E, a plurality of patterned contacts 171 are formed on the second window semiconductor layer 14. Subsequently, the insulation layer 181 is formed to cover side walls of the light-emitting stack 12 and the first semiconductor window layer 13, and further to cover the recess portion 131 of the first semiconductor window layer 13 and the second semiconductor window layer 14, but not to cover the contacts 171. The reflective layer 182 is formed on portions of the insulation layer 181.

Figure 7F:
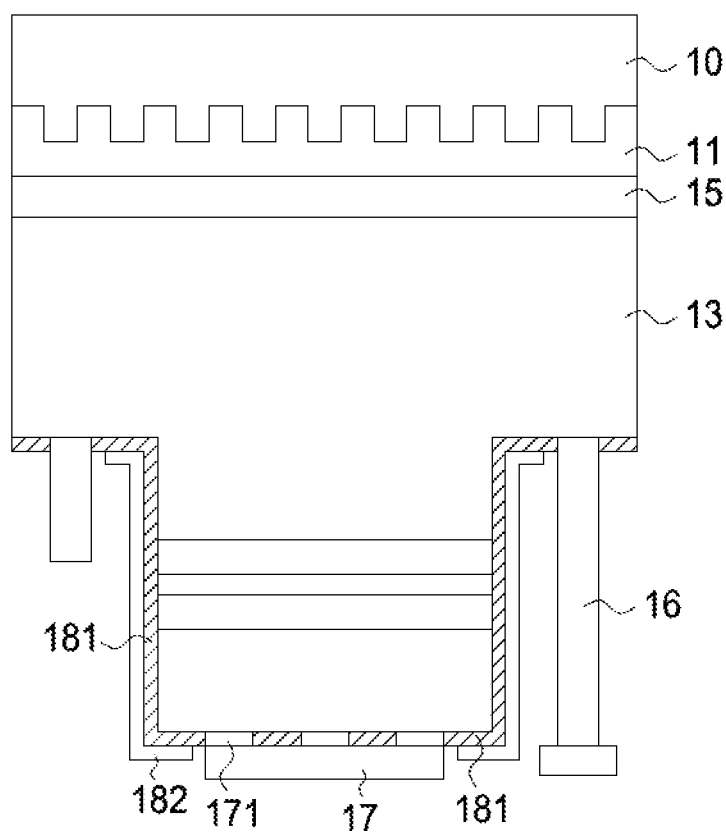

Referring to FIG. 7F, portions of the insulation layer 181 and the reflective layer 182 formed on the recess portion 131 of the first semiconductor window layer 13 are removed to expose parts of the first semiconductor window layer 13. The first electrode 16 is formed on the exposed first semiconductor window layer 13, and the second electrode 17 is formed on the contacts 171 and portions of the insulation layer 180.

Figure 8A:
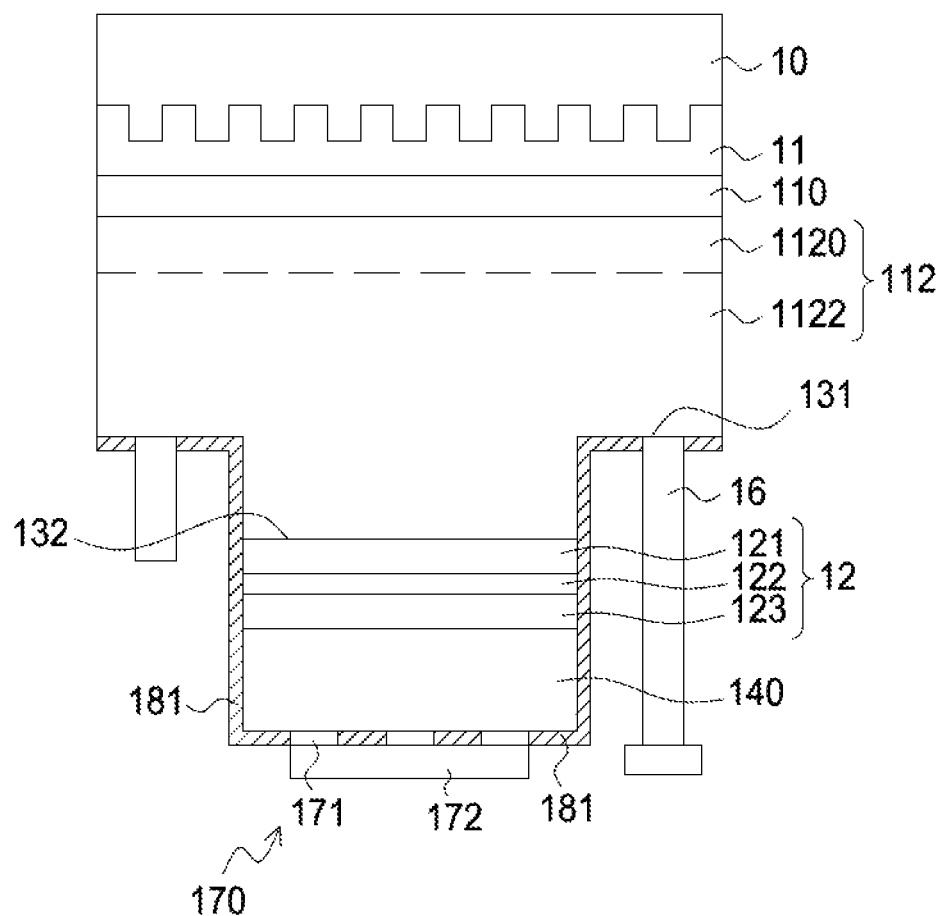
FIGS. 8A to 8B show cross-sectional views of a light-emitting device in accordance with the seventh and the eighth embodiments of the present disclosure.

FIG. 8A discloses a light-emitting device 700 in accordance with the seventh embodiment of the present disclosure. The light-emitting device 700 comprises a permanent substrate 10, an intermediate layer 11 on the permanent substrate 10, a first window layer 112 on the intermediate layer 11, and a light-emitting stack 12 on the first window layer 112. Besides, the light-emitting device 700 further comprises a second window layer 140 formed on the light-emitting stack 12 and is opposite to the first window layer 112 and comprises an insulation layer 181 covering a surface of the second window layer 140. A nucleation layer 110 is between the intermediate layer 11 and the first window layer 112 which comprises a first semiconductor optical layer 1120 and a second semiconductor optical layer 1122. The first window layer 112 in light-emitting device 700 is configured to increase the light extraction in a lateral direction. The first semiconductor optical layer 1120 and the second semiconductor optical layer 1122 are combined to extend the path of the light within the light-emitting device 700 in order to increase the light scattering in a lateral direction. The insulation layer 181 comprises oxide such as $SiO_2$, $Ta_2O_5$, $TiO_2$, $Al_2O_3$, nitride such as $Si_3N_4$, AlN, or polymer. Alternatively, the insulation layer 181 can comprise a multi-layer structure. In another embodiment, the insulation layer 181 can be a distributed Bragg reflector (DBR) layer to decrease the amount of light passing through the side wall of the light-emitting stack 12. Moreover, the insulation layer 181 is configured as a passivation layer to protect the light-emitting stack 12 and the second window layer 140 from reacting with gas surrounding the light-emitting device 700 during manufacturing process.

The first window layer 112 comprises a recess portion 131 and a flat surface 132, wherein the flat surface 132 is connected to the light-emitting stack 12 and the recess portion 131 is not covered by the light-emitting stack 12. The insulation layer 181 covers a side surface and the recess portion 131 of the first window layer 112, and further covers side walls of the light-emitting stack 12 and the second window layer 140. The first window layer 112 further comprises a first semiconductor optical layer 1120 and a second semiconductor optical layer 1122. Moreover, the insulation layer 181 is also formed on the second window layer 140, but not formed on the contacts 171. The contacts 171 are covered by an extension part 172 to form a second electrode 170. The light-emitting device 700 further comprises a first electrode 16 formed on the recess portion 131 of the first window layer 112 not covered by the insulation layer 181, and the second electrode 170 electrically connecting to the light-emitting stack 12 for emitting light. The contacts 171 and the extension part 172 are configured to improve current spreading. Moreover, the materials of contacts 171 and the extension parts 172 are the same or different from other parts.

In this embodiment, the intermediate layer 11 comprises a nitride semiconductor compound; the nucleation layer 110 and the first semiconductor optical layer 1120 comprise a phosphide semiconductor compound. The nitride semiconductor compound can be gallium nitride (GaN), and the phosphide semiconductor compound can be gallium phosphide (GaP). The second semiconductor optical layer 1122 also comprises a phosphide semiconductor compound which is same as the material of the first semiconductor optical layer 1120. Then, the intermediate layer 11 comprises gallium nitride (GaN) with a lattice constant of 3.1 Å and the first semiconductor optical layer 1120 comprises gallium phosphide (GaP) with a lattice constant of 5.45 Å. In other words, the intermediate layer 11 and the first semiconductor optical layer 1120 comprise different group III-V semiconductor compounds (i.e. GaN and GaP). A difference between the lattice constant of the intermediate layer and the lattice constant of the first semiconductor optical layer is greater than 1.5 Å. Preferably, the difference of lattice constants between the intermediate layer 11 and the first semiconductor optical layer 1120 is larger than 2.3 Å and having a lattice mismatch ratio of 74%. In order to reduce the effect of the lattice mismatch, a nucleation layer 110 having a thickness less than that of the first semiconductor optical layer 1120 is formed in advance, wherein the nucleation layer 110 also comprises gallium phosphide (GaP). Then, the first semiconductor optical layer 1120 is formed on a layer having a lattice constant matching with the first semiconductor optical layer 1120. Moreover, the intermediate layer 11 is also lattice mismatched with the permanent substrate 10, wherein the permanent substrate 10 is a non-semiconductor layer and comprises sapphire.

In this embodiment, the intermediate layer 11 has a refractive index between the refractive index of the permanent substrate 10 and the refractive index of the first window layer 112 or the nucleation layer 110. For example, the permanent substrate 10 is a sapphire substrate having the refractive index of 1.7, the intermediate layer 11 comprises gallium nitride or diamond having the refractive index of 2.4, and the first window layer 112 with the nucleation layer 110 comprises gallium phosphide (GaP) having the refractive index of 3.37. In another embodiment, the permanent substrate 10 comprises a different material and has the refractive index ranging from 1.4 to 1.7, the intermediate layer 11 has the refractive index ranging from 1.7 to 3.4, and the first window layer 112 along with the nucleation layer 110 has the refractive index ranging from 2.4 to 3.4. In another portion of the light-emitting device 700, the insulation layer 181 comprises silicon nitride (SiN) and has a refractive index of 2.0 which is smaller than the refractive index of the second window layer 140 which comprises aluminum gallium indium phosphide and has a refractive index between 3.0~3.5.

Since the refractive index is reduced from the first window layer 112 to the permanent substrate 10, the total light reflection in the light-emitting device 700 can be attenuated. Moreover, the refractive index is also reduced from the second window layer 140 (refractive index: 3.0~3.5) to the air (refractive index: ~1) through the insulation layer 181 (refractive index: 2.0), and the total light reflection in the light-emitting device 700 in another direction can be also attenuated. To sum up, the light-emitting device 700 comprises two groups of layers having degraded refractive indexes in two directions wherein the two directions are opposite to each other. Thus, the total internal reflections in two opposite directions within the light-emitting device 700 are attenuated and the light emitting efficiency is improved.

In this embodiment, the permanent substrate 10 is a patterned substrate for improving light efficiency of the light-emitting stack 12. Alternatively, the permanent substrate 10 can have a flat surface for forming layers. In another embodiment, the intermediate layer 11 is formed on the flat surface of the permanent substrate 10 and comprises a plurality of pores for scattering light. The pores are formed by dry etching such as inductive coupling plasma (ICP), or wet etching using potassium hydroxide, oxalic acid, sulfuric-acid, phosphoric acid or combinations thereof.

Figure 8B:
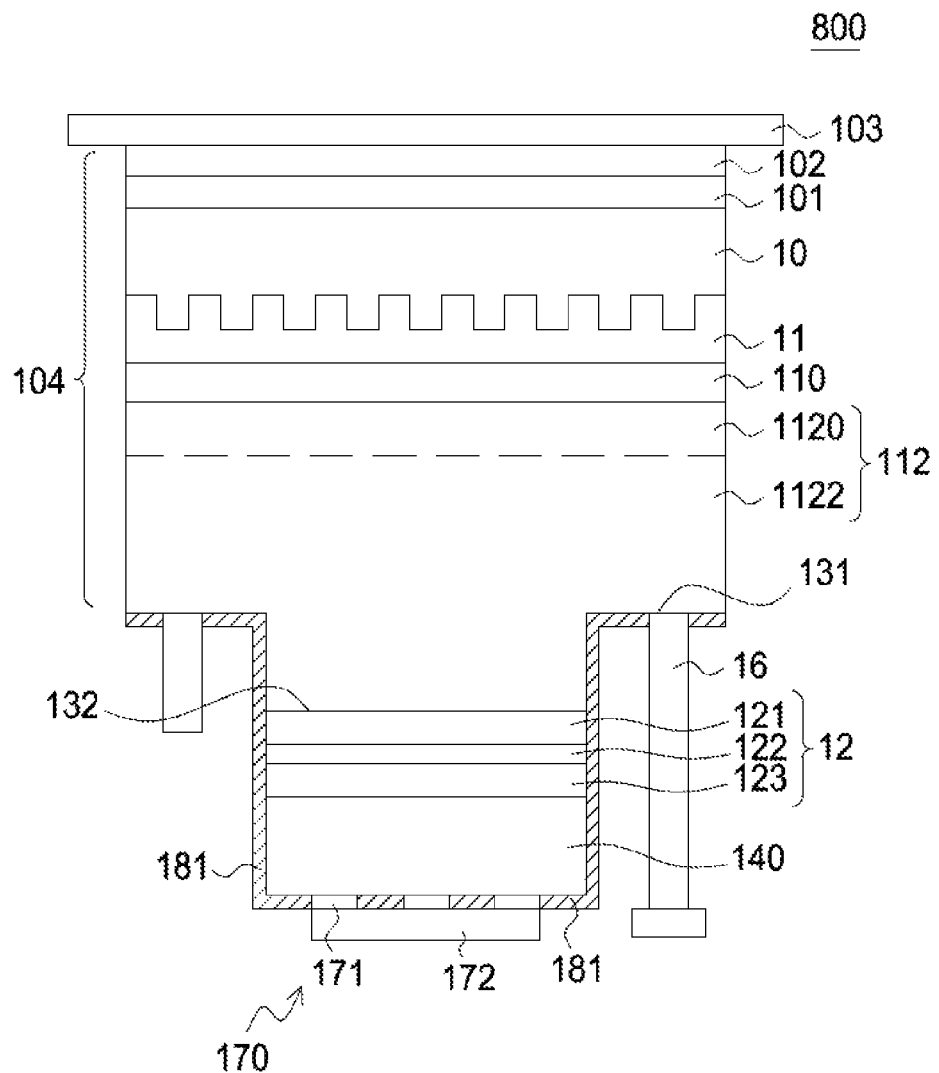

FIG. 8B discloses a light-emitting device 800 in accordance with the eighth embodiment of the present disclosure. The light-emitting device 800 has a similar structure compared with the light-emitting device 700 in FIG. 8A. Light-emitting device 800 further comprises a reflective layer 101 on the permanent substrate 10 and a carrier 103 formed on the reflective layer 101 through an adhesive layer 102. Thus, the reflective layer 101 is formed on a side of the substrate 10 opposing to a side connected to the light-emitting stack 12. In this embodiment, the light emitted from the light-emitting stack 12 passing through the permanent substrate 10 is reflected by the reflective layer 101. The reflected portion of the light passes the side wall 104 toward outside of the light-emitting device 800, wherein the side wall 104 includes the side surfaces of the adhesive layer 102, the reflective layer 101, the permanent substrate 10, the intermediate layer 11 and the first window layer 112. That is, the side wall 104 extends form the carrier 103 to the recess portion 131 of the first window layer 112. Moreover, the carrier attached to the reflective layer 101 is designed to have a larger width compared with the width of the light-emitting stack 12. Then, light is reflected by the reflective layer 101 and the amount of the light in a lateral direction is increased. The lateral direction broadly represents a direction from the substrate 10 toward the ambient through the side wall 104, and the direction is not parallel to the side wall 104.

Figure 9A:
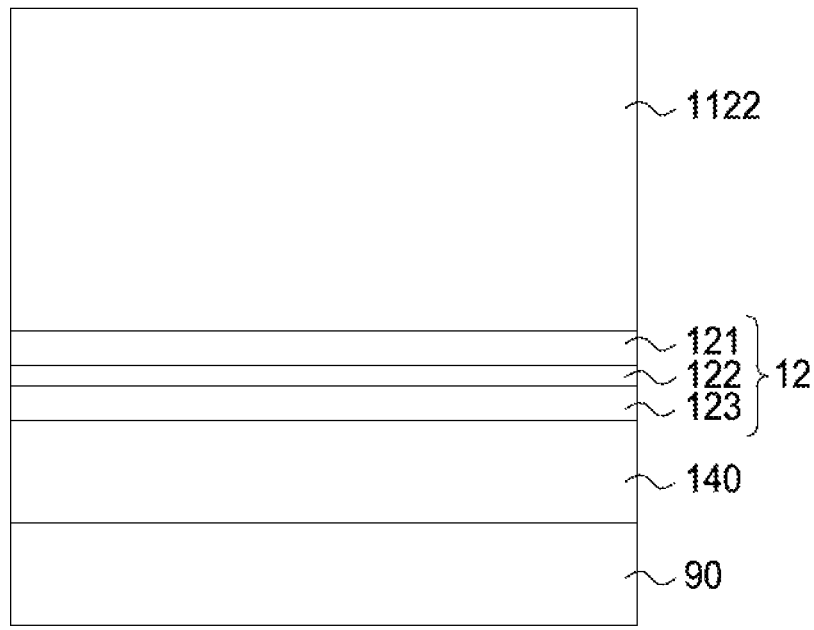
FIGS. 9A to 9G show a method of making a light-emitting device in accordance with the seventh and the eighth embodiments of the present disclosure.

FIGS. 9A-9G illustrate a method of making a light-emitting device in accordance with the seventh and the eighth embodiment of the present disclosure. Referring to FIG. 9A, the second window layer 140 comprising AlGaInP is formed on the growth substrate 90. The light-emitting stack 12 comprising an n-type semiconductor layer 123, an active layer 122, and the p-type semiconductor layer 121 are sequentially formed on the second window layer 140. Then, the second semiconductor optical layer 1122 is formed on the light-emitting stack 12 with a modified thickness for better epitaxy layer quality. The material of the growth substrate 90 comprises sapphire, silicon carbide, gallium nitride, gallium aluminum, and combinations thereof. In another embodiment, the semiconductor layer 121 can be an n-type semiconductor layer and the semiconductor layer 123 can be a p-type semiconductor layer.

Figure 9B:
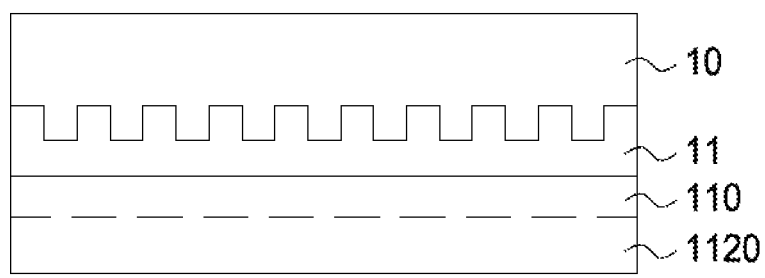

Referring to FIG. 9B, the intermediate layer 11, for example, a GaN layer is formed on the permanent substrate 10. In this embodiment, the permanent substrate 10 is a patterned substrate. Then, the nucleation layer 110 and the first semiconductor optical layer 1120 comprising GaP are sequentially formed on the intermediate layer 11. The nucleation layer 110 and the first semiconductor optical layer 1120 are formed under different temperature. That is, the nucleation layer 110 is grown in a lower temperature while the first semiconductor optical layer 1120 is grown in a higher temperature. To be more specific, the nucleation layer 110 is formed at a temperature between 300~550° C. and the first semiconductor optical layer 1120 is grown at a higher temperature between 600~800° C. The thickness of the first semiconductor optical layer 1120 is larger than that of the nucleation layer 110. In this embodiment, due to different growing temperature and thickness, the defect density of the first semiconductor optical layer 1120 is less than that of the nucleation layer 110 but larger than that of the intermediate layer 11. In another embodiment, the defect density of the first semiconductor optical layer 1120 is larger than or equal to that of the nucleation layer 110. In another embodiment, the defect density of the first semiconductor optical layer 1120 is less than or equal to that of the intermediate layer 11. The growing temperature affects the composition of the nucleation layer 110 and the first semiconductor optical layer 1120. Wherein the nucleation layer 110 comprises more polycrystalline or amorphous structure and less monocrystalline structure than the first semiconductor optical layer 1120 comprises. In this embodiment, the first semiconductor optical layer 1120 comprises a higher defect density than that of the second semiconductor optical layer 1122. Besides, the energy bandgap of the nucleation layer 110 is between that of the intermediate layer 11 and that of the light-emitting stack 12. Wherein the bandgap of the nucleation layer 110 which comprises GaP is 2.3 eV, that of the intermediate layer 11 which comprises GaN is 3.4 eV, and that of the light-emitting stack 12 which comprises AlGaN is 2.1 eV.

Figure 9C:
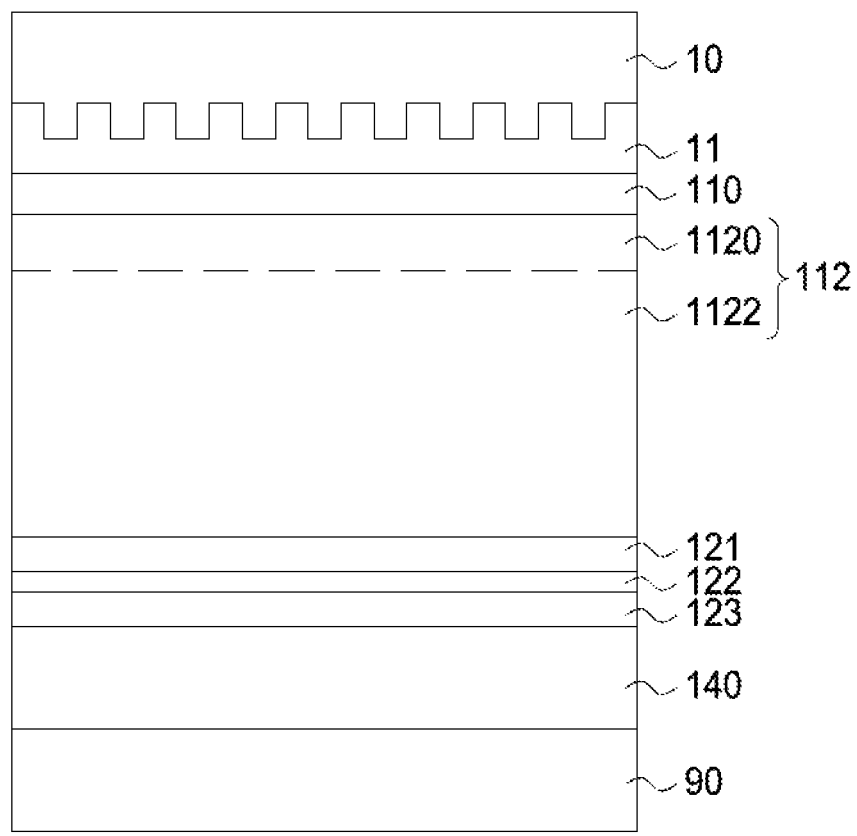

Referring to FIG. 9C, the first semiconductor optical layer 1120 is bonded to the second semiconductor optical layer 1122 without adhesive layer. In this embodiment, a bonded surface is formed between the first semiconductor optical layer 1120 and the second semiconductor optical layer 1122. A surface treatment is performed on the first semiconductor optical layer 1120 and the second semiconductor optical layer 1122 to smooth the surfaces before connecting the structure in FIG. 9A and FIG. 9B. Wherein the surfaces are attached to each other and the surface treatment is applied to enhance the bonding strength between the surfaces. Moreover, the surface treatment also removes impurities on the surfaces and reduces the amount of light being absorbed by the impurities. In another embodiment, the bonded surface is almost diminished after surface treatment applies. The surface treatment can be fast atom bombardment (FAB) or plasma surface treatment. To be more specific, the FAB uses argon as an atom source providing atoms for bombarding the surface and the plasma surface treatment uses oxygen as a plasma source providing plasma hitting the surfaces. After surface treatment, the process of connecting the two structures is performed under a specific vacuum level wherein the reaction chamber for the process has a pressure less than $10^{-5}$ Pa. To be more specific, the process is performed at a vacuum level wherein the pressure of the reaction chamber is between $10^{-6} \sim 10^{-8}$ Pa.

Figure 9D:
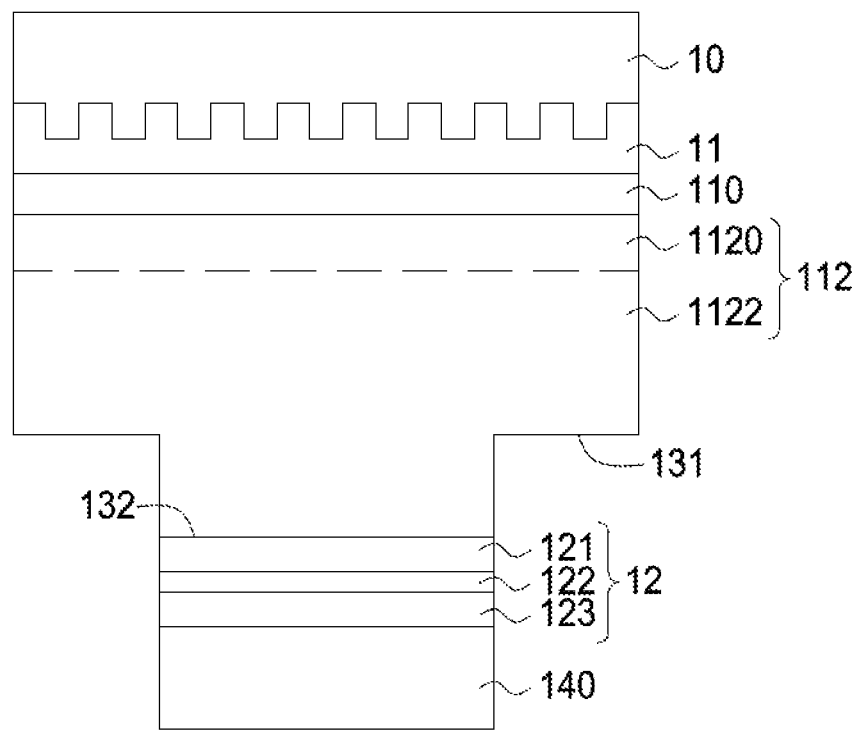

After connecting the first semiconductor optical layer 1120 and the second semiconductor optical layer 1122, the growth substrate 90 is removed, Referring to FIG. 9D, portions of the n-type semiconductor layer 123, the active layer 122, the p-type semiconductor layer 121, the second semiconductor optical layer 1122, and the second window layer 140 are removed to expose the first window layer 112. To be more specific, portions of the first window layer 112 are removed to form a recess portion 131 and a flat surface 132 is defined between the light-emitting stack 12 and the second semiconductor optical layer 1122.

Figure 9E:
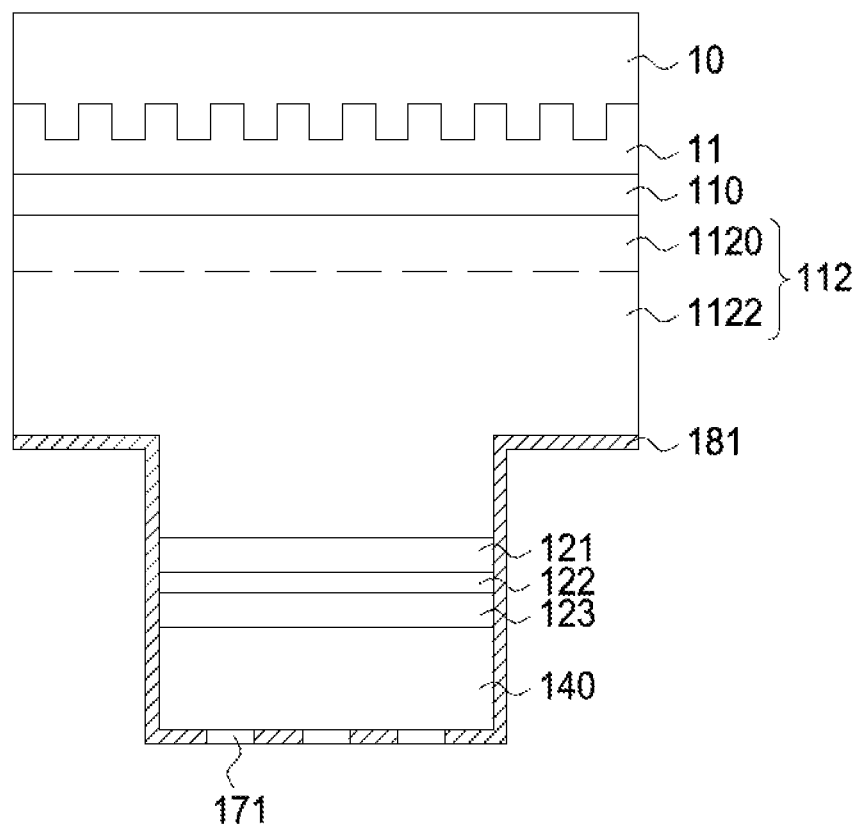

Referring to FIG. 9E, a plurality of contacts 171 are formed on the second window layer 140. Then, the insulation layer 181 is formed to cover side walls of the light-emitting stack 12, side walls of the first window layer 112, the recess portion 131 of the first window layer 112, and the second window layer 140, but not to cover the contacts 171.

Figure 9F:
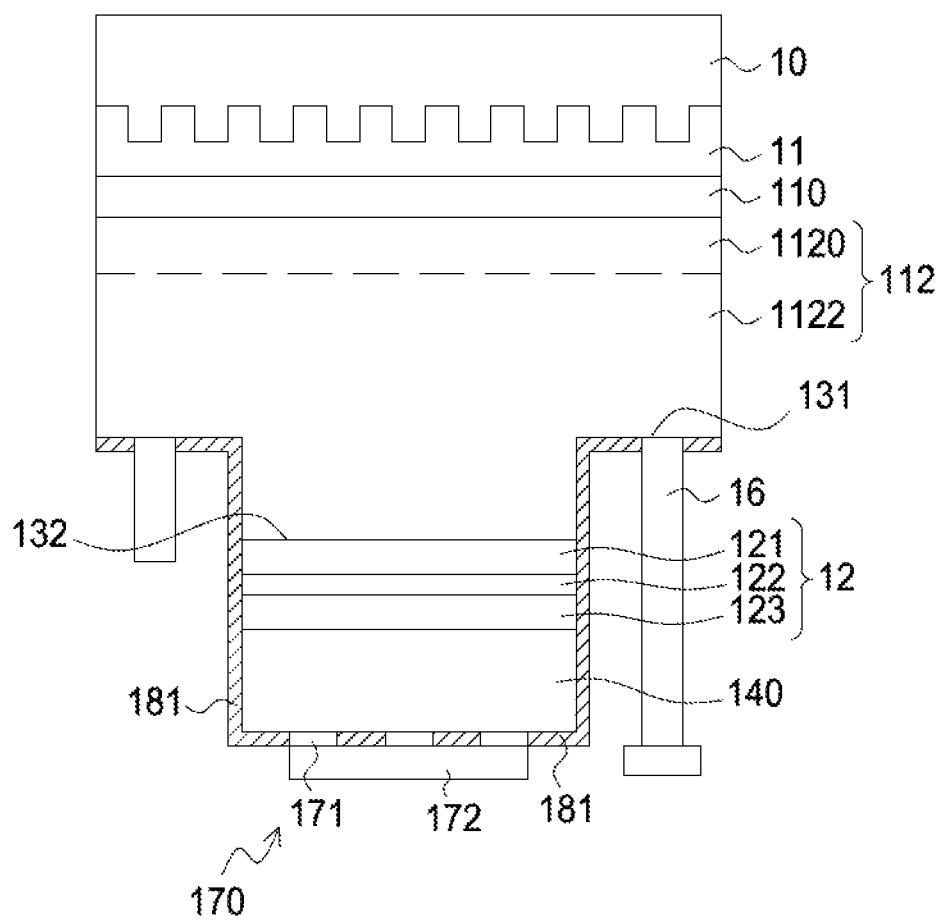

Referring to FIG. 9F, portions of the insulation layer 181 formed on the recess portion 131 of the first window layer 112 are removed to expose parts of the first window layer 112. Then, the first electrode 16 is formed on the exposed first window layer 112, and an extension part 172 is formed on the contacts 171 to form the second electrode 170.

Figure 9G:
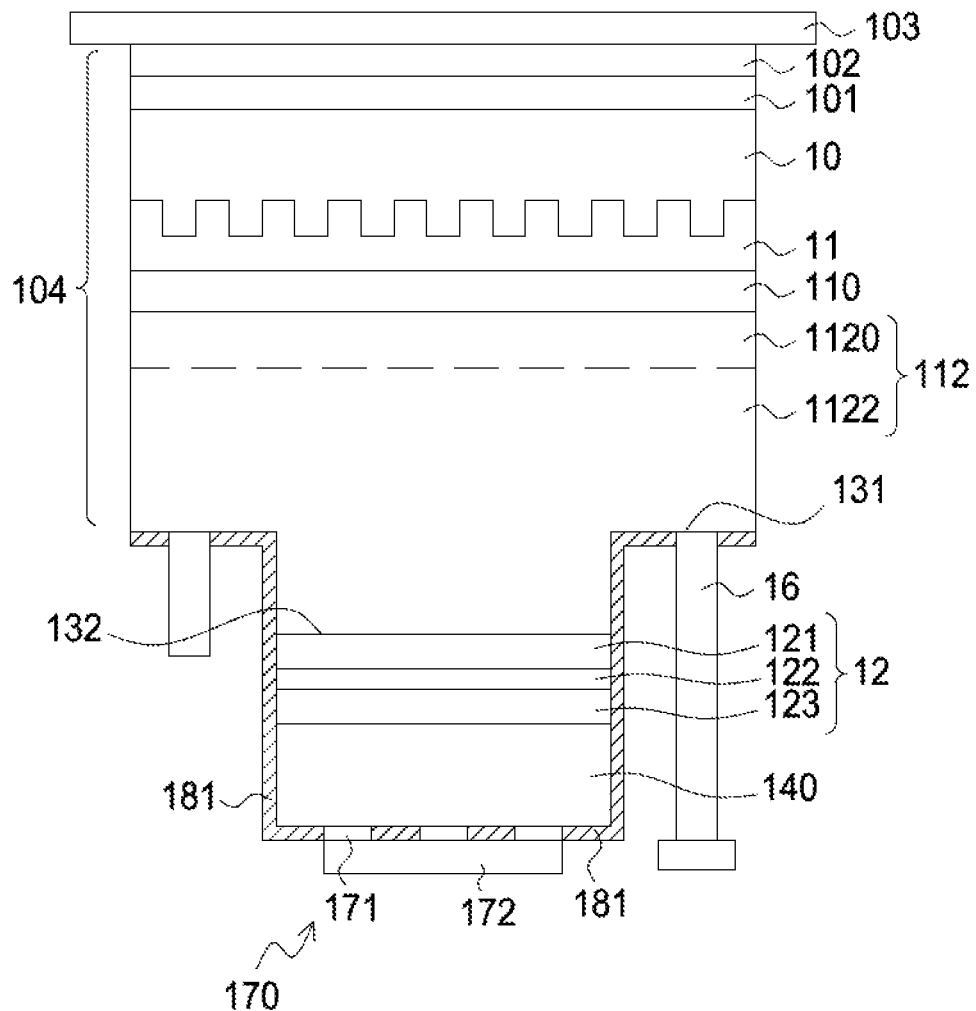

Referring to FIG. 9G, a reflective layer 101 to increase the lateral light extraction is formed on a surface of the permanent substrate 10 opposite to the light-emitting stack 12. Then, a carrier 103 is formed on the reflective layer through an adhesive layer 102. The reflective layer 101 and the adhesive layer 102 have widths substantially the same as the width of the permanent substrate 10. The carrier 103 has a width wider than that of the reflective layer 101 or that of the first window layer 112.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device, comprising:
   a substrate;
   an intermediate layer on the substrate;
   a first window layer comprising a first semiconductor optical layer on the intermediate layer and a second semiconductor optical layer on the first semiconductor optical layer; and
   a light-emitting stack on the second semiconductor optical layer;
   wherein a difference between the lattice constant of the intermediate layer and the lattice constant of the first semiconductor optical layer is greater than 2.3 Å.

2. The light-emitting device of claim 1, wherein the first semiconductor optical layer comprises a higher defect density than that of the second semiconductor optical layer.

3. The light-emitting device of claim 1, wherein the intermediate layer and the first semiconductor optical layer comprise different group III-V semiconductor compounds and the substrate comprises a non-semiconductor material.

4. The light-emitting device of claim 1, further comprising a nucleation layer between the intermediate layer and the first window layer.

5. The light-emitting device of claim 4, wherein the first semiconductor optical layer comprises a phosphide semiconductor compound.

6. The light-emitting device of claim 4, wherein the intermediate layer comprises a nitride semiconductor compound and the nucleation layer comprises a phosphide semiconductor compound.

7. The light-emitting device of claim 4, further comprising:
   a second window layer on a side of the light-emitting stack opposite to the first window layer; and
   a passivation layer on the first window layer and the second window layer.

8. The light-emitting device of claim 7, further comprising a first electrode on the second window layer not covered by the passivation layer and a second electrode on the first window layer not covered by the passivation layer.

9. The light-emitting device of claim 7, wherein the passivation layer has a refractive index smaller than the refractive index of the second window layer.

10. The light-emitting device of claim 9, wherein the intermediate layer has a refractive index between the refractive index of the substrate and the refractive index of the nucleation layer or the first window layer.

11. The light-emitting device of claim 4, wherein an energy bandgap of the nucleation layer is between that of the intermediate layer and that of the light-emitting stack.

12. The light-emitting device of claim 4, wherein the nucleation layer is lattice matched with the first window layer and lattice mismatched with the intermediate layer.

13. The light-emitting device of claim 12, wherein the substrate is lattice mismatched with the intermediate layer.

14. The light-emitting device of claim 5, wherein the nucleation layer has a thickness less than a thickness of the first semiconductor optical layer.

15. The light-emitting device of claim 1, wherein the first semiconductor optical layer and the second semiconductor optical layer comprise the same material.

16. The light-emitting device of claim 1, further comprising a bonded interface between the first semiconductor optical layer and the second semiconductor optical layer.

17. The light-emitting device of claim 1, further comprising a reflective layer formed on a surface of the substrate opposite to the light-emitting stack.

18. The light-emitting device of claim 1, wherein the nucleation layer comprises gallium phosphide (GaP).

19. The light-emitting device of claim 18, wherein the intermediate layer comprises gallium nitride (GaN).

20. The light-emitting device of claim 1, wherein the intermediate layer comprises gallium nitride (GaN).

* * * * *